United States Patent [19]
Osann, Jr. et al.

[11] Patent Number: 6,133,582
[45] Date of Patent: Oct. 17, 2000

[54] METHODS AND APPARATUSES FOR BINNING PARTIALLY COMPLETED INTEGRATED CIRCUITS BASED UPON TEST RESULTS

[75] Inventors: Robert Osann, Jr., Los Altos; Shafy Eltoukhy, Los Gatos, both of Calif.

[73] Assignee: Lightspeed Semiconductor Corporation, Sunnyvale, Calif.

[21] Appl. No.: 09/079,016

[22] Filed: May 14, 1998

[51] Int. Cl.[7] .................................................... H01L 23/58
[52] U.S. Cl. ........................... 257/48; 257/210; 257/211; 257/758; 257/797; 324/765; 324/769; 438/11
[58] Field of Search .............................. 257/48, 202, 758, 257/203, 208, 210, 211, 797; 324/769, 765; 438/11

[56] References Cited

U.S. PATENT DOCUMENTS

| | | | |
|---|---|---|---|
| 5,059,899 | 10/1991 | Farnworth et al. | 324/158 R |
| 5,206,181 | 4/1993 | Gross | 437/8 |
| 5,631,478 | 5/1997 | Okumura | 257/211 |
| 5,640,049 | 6/1997 | Rostoker et al. | 257/758 |
| 5,654,204 | 8/1997 | Anderson | 438/15 |
| 5,726,458 | 3/1998 | Bui | 257/48 |
| 5,861,660 | 1/1999 | Mc Clure | 257/620 |
| 5,917,197 | 6/1999 | Alswede et al. | 257/48 |
| 5,956,566 | 9/1999 | Lin et al. | 438/17 |

FOREIGN PATENT DOCUMENTS 0 681 323 A2  8/1995  European Pat. Off. .

*Primary Examiner*—William Mintel
*Attorney, Agent, or Firm*—Fliesler, Dubb, Meyer & Lovejoy

[57] ABSTRACT

A gate array integrated circuit wafer is formed having M-N generic metal interconnection layers and having performance and/or electrical testing circuits which are operative using only the M-N generic metal interconnection layers. The performance and electrical testing circuits are located in the active chip area and/or in the scribe line area between dies on the wafer. Performance and/or electrical tests are performed after generic fabrication is completed, but before the final customization of the wafers. Wafers are sorted and assigned to performance and/or yield bins based upon the results of the performance and/or electrical tests. The contents of different bins are provided to different customers for addition of the final N application specific metal interconnection layers based upon the customer's performance and/or yield requirements. In another embodiment, all M layers are deposited prior to performance and/or electrical testing; however, the Mth layer is not etched within the active die area prior to performance and/or electrical testing. Subsequent to binning based upon the test results, the final customization is performed by etching the Mth metal layer. Further, a programmable gate array integrated circuit which has features for testing and binning for speed and performance grading prior to final personalization or programming on the top layer or layers of interconnecting material is provided.

18 Claims, 14 Drawing Sheets

METHODS AND APPARATUSES FOR BINNING PARTIALLY COMPLETED INTEGRATED CIRCUITS BASED UPON TEST RESULTS

BACKGROUND OF THE INVENTION

1. Field of the Invention

The present invention relates to the field of fabrication and testing of gate array integrated circuits. Specifically, the present invention relates to assessing the performance and/or yield of generically fabricated gate array wafers so as to enable the allocation of the generically fabricated gate array wafers to a suitable application specific custom design. The present invention includes a method for providing fast turn high performance gate array or sea of gates integrated circuits. In particular, the present invention includes a high yield method for fabricating gate array integrated circuits having a much higher maximum speed performance specification than the semiconductor fabrication process used for the fabrication of the integrated circuits can generally guarantee.

2. Discussion of the Related Art

Gate array or sea of gates integrated circuits are well known in the art. It is to be understood that the term "gate array" as used hereinafter also includes sea of gates and sea of modules. An example of gate array technology is disclosed by R. Gregor et al. in a paper entitled "A One-million-circuit CMOS ASIC Logic Family" published in *Proceedings of IEEE* 1993 *Custom Integrated Circuits Conference*, pp. 23.1.1–23.1.4 (1993).

Such gate array integrated circuits are normally fabricated with an array of generic modules or transistors that can be interconnected via interconnection layers that are fabricated later and are customized to certain patterns relating to the customers' design. Wafers with the generic module arrays or transistor arrays are fabricated without the interconnection layers and are then inventoried for later customization after some simple generic parameter tests.

Performance testing typically includes measuring the speed of the silicon. The maximum operating frequency of the integrated circuit can be deduced from the speed of the silicon. Performance testing requires operating the integrated circuit through external connections which are typically applied to the integrated circuit's top metal layer.

Performance testing of the generic gate array wafers is not conventionally performed. In fact, prior to inventory, no performance testing is even possible because no metallization layers have been applied to the chip. Therefore, without a top metal layer to which to connect, the performance tester cannot make connection to the generic gate array wafer prior to inventory.

The speed performance of an integrated circuit depends on many factors. For example, the actual circuits implemented by the integrated circuit greatly affect the measured speed. The resistances, capacitances, and inductances created by wiring layer interconnections of active elements on the integrated circuit affect performance. The parasitic elements that are inevitably introduced during the semiconductor fabrication process used for the fabrication of the circuit affect performance. The parasitic elements are resistances, capacitances, and inductances. All wiring layers and the diffusion material used to form the transistors have finite non-zero resistances. Parasitic capacitances exist due to the proximity of neighboring devices and interconnection structures and due to the characteristic of the specific semiconductor fabrication process used. The capacitances and inductances of the interconnection of active elements depend on the lengths of the interconnecting elements, proximity to other interconnecting elements, and the capacitance and inductance per unit length, which are process dependent. The gain and characteristic of the active transistor elements are also process dependent.

The values of the parasitic elements, gains of active elements, and capacitance and inductance per unit length vary due to process variations from wafer to wafer in the same or different process lots and from die to die on the same wafer. The process parameters applied to each successive wafer can only be duplicated from wafer to wafer within a certain non-zero tolerance. Therefore, the processing of each wafer typically varies slightly within the tolerance which can be achieved with the process tools. This wafer-to-wafer process variation results in slightly different performance parameters for each wafer. Moreover, because all dies on the same wafer are physically positioned in different positions relative to the various components of the process tools, each of the dies on a given wafer is exposed to slightly different process conditions. However, the variation of the parameters between dies on the same wafer tends to be smaller than the variation of the parameters from wafer to wafer. In other words, the parameters tends to track from die to die on the same wafer.

The smaller inter-wafer and larger intra-wafer variations of these parameters cause a specific integrated circuit design to have upper and lower performance values. The upper and lower performance values represent the statistically best case and statistically worst case, respectively, that can reasonably be expected for the specific integrated circuit taking the above-mentioned process variations into account. In order to guarantee correct functionality of the circuit when it is used in a system, it is customary and necessary in engineering practice to use the lower performance value as the specification of the system including the integrated circuit. Therefore, the performance specification of the integrated circuit often sets the performance level of the system in which the integrated circuit exists.

If the worst case is used as the specification, then all parts will conform to the performance specification because all parts will, by definition, meet or exceed the worst case. Therefore, all dies which are correctly fabricated will be usable in a system. Therefore, this conventional specification strategy results in a somewhat low overall system performance level. The performance level is deemed to be somewhat low particularly because most of the integrated circuits can function successfully at significantly higher performance levels than that specified by the worst case.

One way to achieve higher system performance, and thereby solve the above-mentioned problem, is to sort the integrated circuit after it is completely fabricated through the semiconductor fabrication process. The dies are tested for functionality to separate the good dies from the bad dies. Bad dies are those dies which have fatal flaws in them such that they are inoperative and do not function correctly at any speed. The ratio of good dies to total dies is typically referred to as the "yield" of the process. The good dies are tested with special test vectors and procedures in order to separate the higher performance dies from the lower performance dies. The performance sorted dies can then be used in higher and lower performance systems accordingly depending on the requirements and the designs of the systems. This approach is suitable for systems where lower performance parts are acceptable for a lower performance version of the system.

FIG. 1 illustrates a typical design scenario. A nearly gaussian distribution of wafer speeds is assumed. The probability distribution 101 of a wafer having a maximum speed f is plotted having probability on the y-axis and speed on the x-axis. Three separate performance specifications are shown corresponding to three separate designs. Design A must have a speed of at least f1; design B must have a speed of at least f2; and design C must have a speed of at least f3. For the sake of convenience, the three performance specifications f1, f2, and f3 happen to divide the probability distribution 101 into thirds. The area 102 under the probability distribution 101 between f1 and f2 is ⅓; the area 103 under the probability distribution 101 between f2 and f3 is ⅓; and the area 104 under the probability distribution 101 between f3 and infinity is ⅓. In general, the performance specification and probability distributions may be arbitrary.

However, in many cases the higher performance parts are the only acceptable parts, thus the lower performance parts are disposed of as bad components and are categorized as bad dies. This approach increases the cost of the integrated circuit substantially due to the additional testing requirement and the lower yield due to the cost of the disposed lower performance parts.

FIG. 2 illustrates a conventional gate array fabrication method. At step 201, a conventional gate array integrated circuit manufacturer produces the gate array integrated circuit wafer stopping before the first interconnecting metal. The wafer is removed from the process tools and is inventoried at step 202 for all customers. At this point the wafer has no application specific fabrication associated with it; it is generic.

When a certain customer wishes to implement his application specific custom design, he retrieves the wafer from an inventory. At step 203, fabrication is resumed and the metallization layers are deposited and etched. This step 203 includes formation of the application specific custom metallization layers. At step 204 the wafer is cut into individual gate array integrated circuit dies. At step 205, performance testing on the individual gate array integrated circuit dies is performed. At step 206, the individual gate array integrated circuit dies are sorted according to their measured performance which was obtained in step 205.

Conventionally, since the integrated circuit is not yet complete at the time of inventory after generic fabrication, performances of the dies on the wafer are not fully characterized. It is not possible to do any performance testing at this time. Worst case parameters are assumed in order to guarantee functionality for all statistically possible variations of parameters.

FIG. 3 illustrates how the conventional method described in FIG. 2 applies to the hypothetical situation described in FIG. 1. The generic gate array integrated circuit wafers are fabricated at step 301 and inventoried at step 302. Some of the inventoried wafers are used at step 303 to fabricate the custom design A; others of the inventoried wafers are used at step 304 to fabricate the custom design B; while yet others of the inventoried wafers are used at step 305 to fabricate the custom design C. At step 306 it is determined that all design A parts meet the f1 performance specification. At step 307 it is determined that only two-thirds of the parts having design B meet the performance specification f2, and at step 309 one-third of the parts having design B are slower than f2. At step 308, it is determined that only one-third of the parts having design C meet the performance specification f3, and at step 310 it is apparent that two-thirds of the design C parts are slower than f3. Thus, in the high performance category, the acceptable yield is only approximately 33%.

As is apparent from the above discussion, a need exists for an integrated circuit fabrication method which increases the usable yield of gate array integrated circuits which must meet a high performance specification.

SUMMARY OF THE INVENTION

Conventional mask-programmed gate array or sea of gates integrated circuits suffer from the limitation that a customer will receive and must accept all devices which fall within the extremes of the performance specifications which are allowed by the semiconductor fabrication process. To overcome this limitation, the present invention allows testing of the performance of the integrated circuit before fabrication is complete, and specifically, before customization is performed.

According to a method of fabrication of gate array integrated circuit wafers according to the present invention, instead of building an inventory of wafers before the first interconnecting layer, wafers are processed with the generic circuit elements designed for the gate array or sea of gate integrated circuits up to but not including the last N layers which are used for personalizing the gate array or sea of gate integrated circuit for certain specific customer designs. The value of N is less than the total number of layers M available for interconnection for a given semiconductor fabrication process. (M-N) layers are used for interconnection needed to create the generic modules in the gate array integrated circuit. Test circuits, designed to be completely interconnected and functional only using the (M-N) layers of interconnection layers on top of the active layers, are provided inside the active area of the dies and/or in the scribe line areas between dies.

These test circuits on all the wafers that have been processed up to the (M-N)th layers of interconnection layers are tested for performance at the wafer level. Based on the performance of the test circuits in each wafer, the wafers are sorted into different bins corresponding to their expected performance. A wafer is retrieved from a performance bin corresponding to the performance requirement of the custom design. Application specific custom fabrication is completed by adding the remaining N layers for their specific circuits.

Since the test circuits are individually tested on a wafer by wafer basis, the performance data based on the test results of these test circuits can be very accurate for the wafer. Since the variations of the values of the parasitic elements, gains of active elements, and capacitance and inductance per unit length between dies on the same wafer tend to be small, the test results from the test circuits give a reasonably accurate indication of the performance of the neighboring circuits. In addition, when the value of N is small, the effect of the additional parasitic elements, that are added when the final N interconnection layers are fabricated, to the final performance of the circuit can be very small. Therefore, according to the present invention, it is possible to use this method to accurately sort the unfinished wafers for an arbitrary number of different performance grades.

According to an alternate embodiment of the present invention, the test circuits can be constructed in a similar way to the previous embodiment, except that connections are made up to and including the top layer metal (Mth Layer) before testing is done. The top metal layer is etched to complete the fabrication of the test circuit connections; however, photoresist is applied to completely cover all top surfaces of the wafer except those areas where the test circuits are located. In the areas of the test circuits, the photoresist is selectively applied in an appropriate pattern.

As a result, prior to testing, those areas of the top layer metal which will later be etched to configure the devices for a customer's application, are not yet etched. Following performance testing, the wafers are inventoried according to speed. Later, the appropriate wafers are etched (again) on top layer metal to configure the wafers to implement a customer's required function. During the customization etching, the test circuits may be covered with photoresist, although this is not required because the test circuits need not be used further.

In yet another alternative embodiment of the present invention, in addition to or in alternative to providing performance data, electrical test data may be obtained. The electrical test data provides some indication of the potential yield of a wafer. A wafer that has poor yield data from the test circuits can be rejected entirely, thus saving the time and cost of subsequent processing. In addition, if these tests are used as acceptance tests for the wafers, no cost will be incurred because rejected wafers are usually not charged by the semiconductor fabrication process foundries. This has a potential for increasing the yield of the "good" wafers and can provide the savings which are used for the addition testing caused by this binning process.

These and other features and advantages of the present invention are more fully described in the Detailed Description of the Invention as illustrated in the Figures.

DETAILED DESCRIPTION OF THE INVENTION

Conventional application specific gate array integrated circuit fabrication methods produce low usable yield for gate array integrated circuits which must meet a high performance specification relative to the expected performance of the fabrication process generally.

Figure 4:
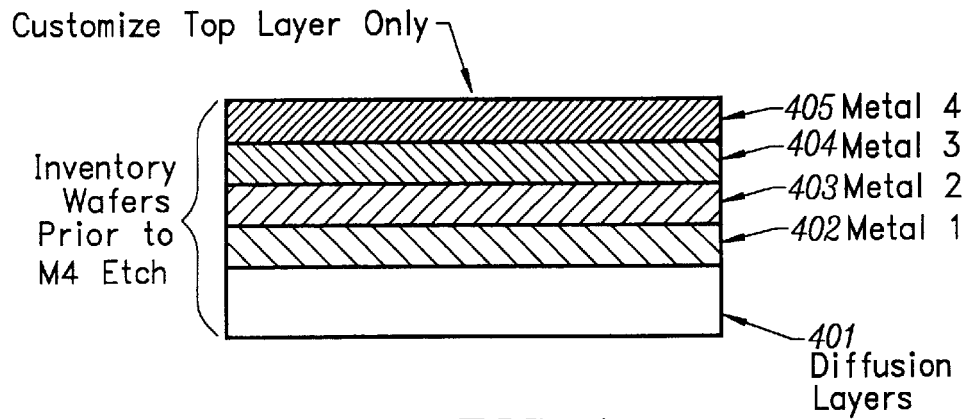
FIG. 4 is a cross-sectional drawing illustrating a wafer that has four layers of metal interconnection. Typically, there are insulating layers in between the interconnecting layers. These insulating layers are not shown in the figure. Only the top layer is used for customization based on the specific circuit design.

FIG. 4 is a simplified drawing of the cross section of a wafer that has four layers of metal interconnection 402–405. There are also insulating layers in between the interconnecting layers. These insulating layers are not shown in FIG. 4. The detailed structures in the diffusion layers, such as wells and transistor sources and drains are also not shown. The details in these layers vary depending on the semiconductor fabrication process; however, the general structure and content are well known in the art and are usually easily available from the semiconductor fabrication process foundry manufacturing the wafers.

Although the Figures and the description of the present invention show four metal layers of interconnection, this number of metal layers is offered by way of example only, not by way of limitation. More or less than four metal layers of interconnection are common depending on the semiconductor fabrication process. The methods and apparatuses according to the present invention are extendable to any number of layers.

Also shown in FIG. 4, only the top metal layer 405 of the four interconnection layers 402–405 is used for customization. The present invention is applicable to more than one layer of customization. For example, layers 404 and 405 could be customized layers while layers 402 and 403 are generic layers.

As illustrated in FIG. 4, the lower three layers of interconnection are used for the internal interconnection of generic modules partially formed and defined in the diffusion layers underneath the interconnection layers.

Figure 5:
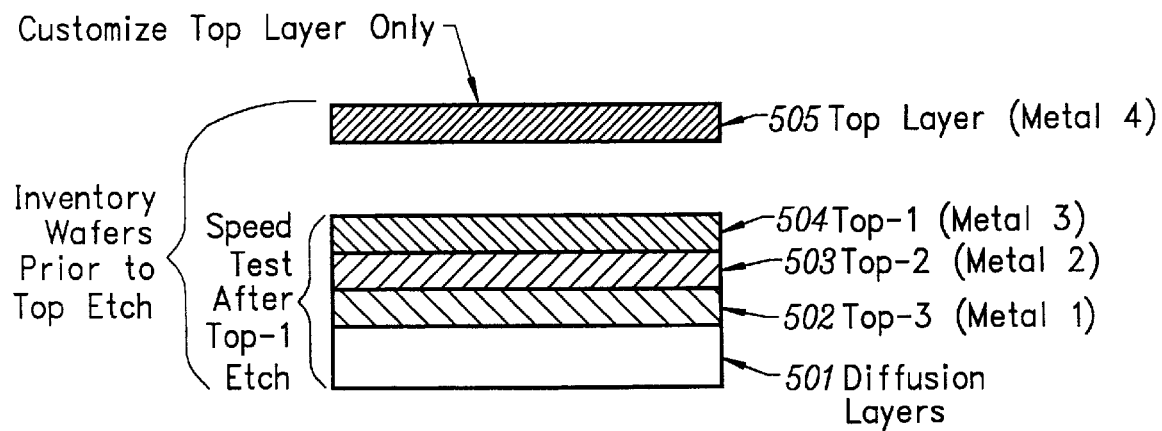
FIG. 5 is a cross-sectional drawing of a wafer that has four layers of metal interconnection. According to an aspect of the present invention, the bottom three metal layers are processed and tested before the deposition of the top metal layer. The wafers are sorted and inventoried in different bins based on the test results.
Figure 7:
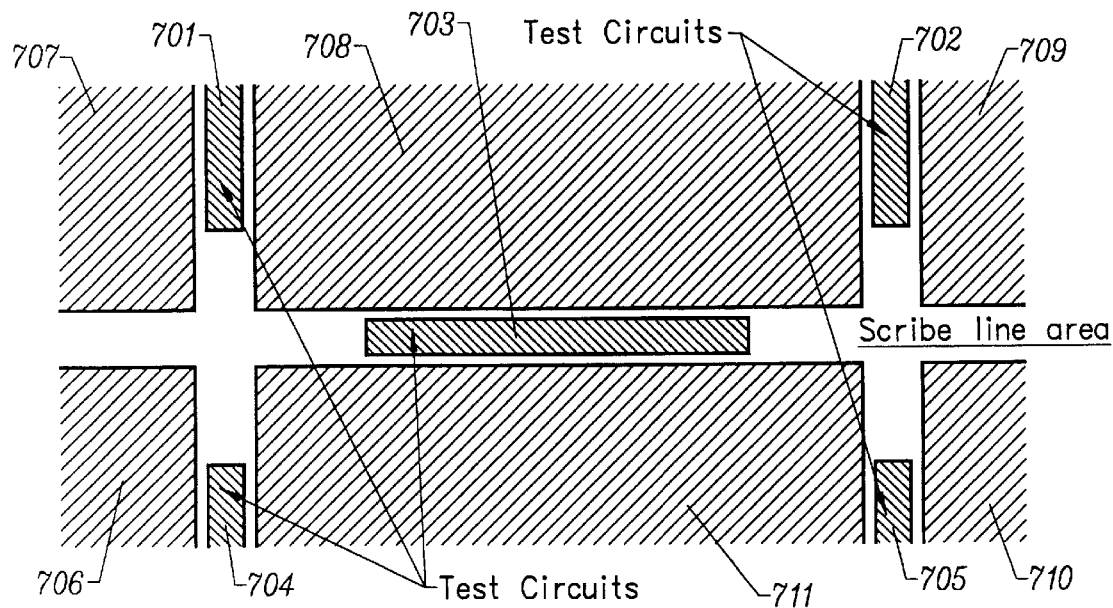
FIG. 7 is a close-up view of the scribe line area, which shows the test circuit blocks according to an aspect of the present invention positioned around the dies and inside the scribe line area.

FIG. 5 is another drawing of the cross section of a wafer that has four layers of interconnection. The details of the insulation layer and the substrate structure are again not shown in FIG. 5 as explained above with regard to FIG. 4. The bottom three metal layers 502–504 together with the diffusion layers are processed and tested before the top layer 505 is deposited. As they are processed, the wafers are sorted based on the performance measured from the test circuits (not shown) provided in the inside of the die and/or in the scribe line area as illustrated in FIG. 7. The wafers are then inventoried in different performance bins based upon the test results.

Figure 6:
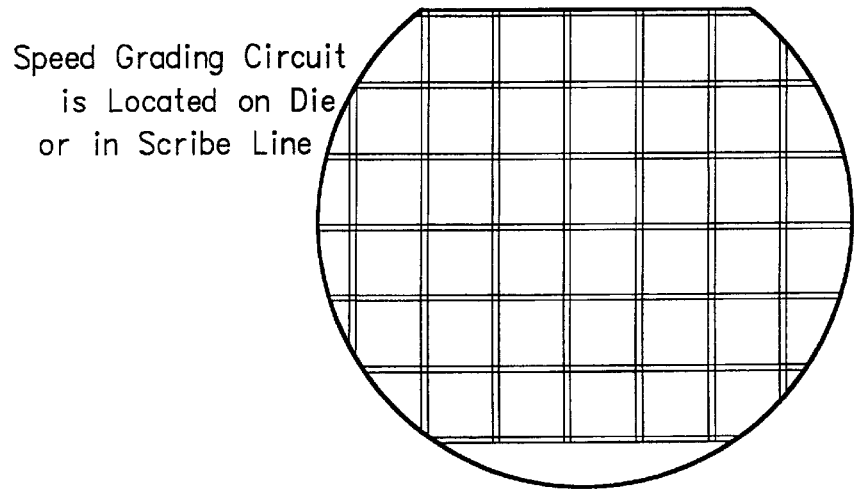
FIG. 6 is a drawing of a wafer with scribe lines drawn. According to the present invention, speed grading circuits are located in the scribe line area and/or in the active area of the dies.

FIG. 6 is a drawing of a wafer having scribe lines identified. Speed grading performance test circuits are located in the scribe line area and/or in the active area of the dies. FIG. 7 illustrates a close-up view of some of the scribe line areas. Performance test circuit areas 701–705 are illustrated in the scribe line areas.

In FIG. 7, the test circuit areas 701–705 are shown as shaded block areas next to the dies 706–711 in the area between the dies. The grid-like vertical and horizontal areas are called scribe line areas because these are the areas where a diamond saw will cut through the wafer to physically separate the dies 707–711. It is acceptable to locate the performance test circuits 701–705 in these scribe line areas because the performance test circuits are no longer used once the top layer of interconnection is deposited and patterned according to customer's application specific custom design.

Figure 8:
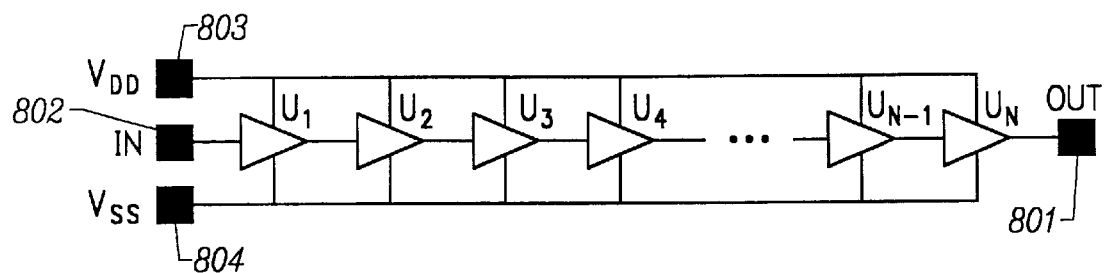
FIG. 8 is a logic diagram of a suitable speed grading circuit used for performance testing according to the present invention.
Figure 11:
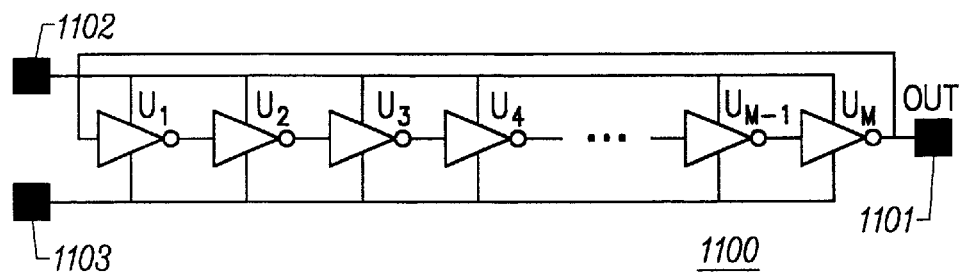
FIG. 11 is a logic diagram of another suitable speed grading circuit used for performance testing according to the present invention.

A variety of performance test circuits can be used for testing the performance of the wafers according to the present invention. FIGS. 8 and 11 illustrate the logic diagrams of two of the more commonly used performance test circuits.

Figure 9:
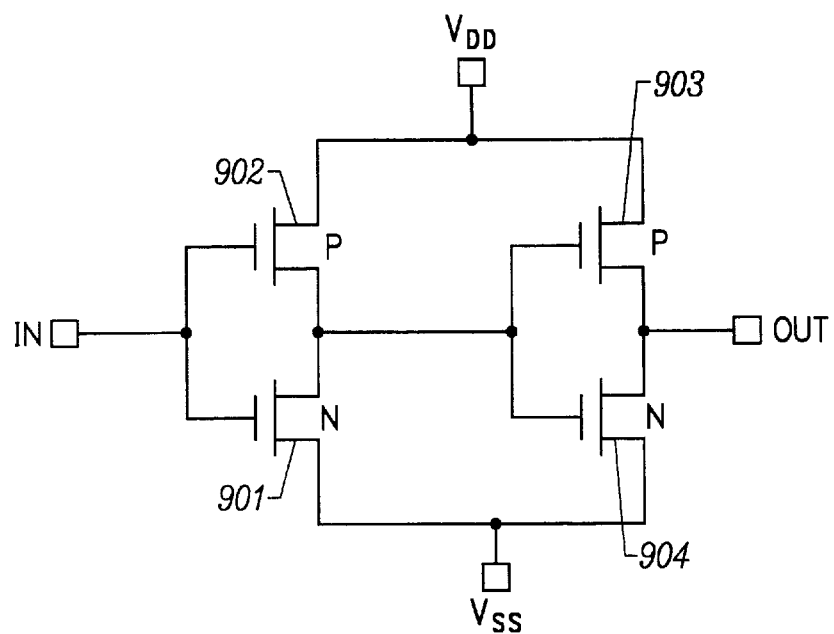
FIG. 9 is a transistor schematic diagram for a CMOS buffer such as used in the logic diagram of FIG. 8.
Figure 10:
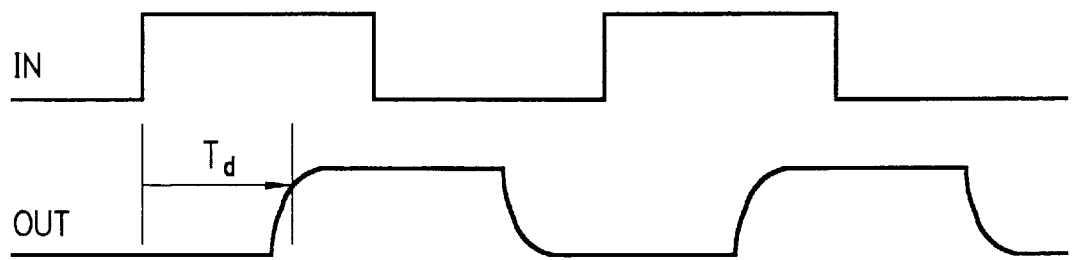
FIG. 10 shows the waveforms of the input and output signals which typically appear in a performance test using the terminals IN and OUT of the circuit illustrated in FIG. 8.

Referring now to FIG. 8, U1 through UN are non-inverting buffers which can each be implemented in CMOS using four transistors 901–904 configured as shown in FIG. 9. By connecting any whole number N of them in series as shown in FIG. 8 and by injecting an input signal as the "IN" signal shown in FIG. 8, one can measure the delay Td from the relationship of signal "IN" and the output signal "OUT", as illustrated in FIG. 10. Td is the propagation delay of N buffers plus the delay from the input terminal and the output terminal. An inverse relationship exists between the measured Td and the speed of the wafer; smaller Td means higher performance, and larger Td means lower performance.

Figure 12:
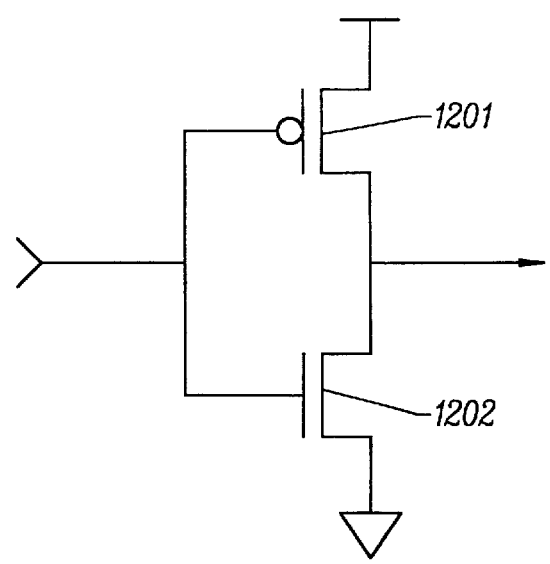
FIG. 12 is a transistor schematic diagram for a CMOS inverter such as used in the logic diagram of FIG. 11.

FIG. 11 is a logic diagram of another example speed grading circuit using a series of an odd number M of inverters. The circuit of FIG. 11 is often referred to as a "Ring Oscillator" because the circuit is configured in a ring and does not require any input. Because there are an odd number of inversions around the ring, there is no static solution to the logic states of the input and output nodes of each inverter. The output 1101 of the ring oscillator 1100 starts to oscillate between VDD and VSS as soon as the VDD and VSS terminals are connected to the power supply VDD and VSS. FIG. 12 illustrates a standard CMOS inverter which may be used to implement each stage of the ring oscillator.

Figure 13:
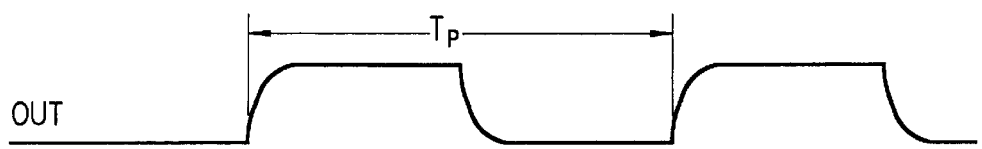
FIG. 13 is an output waveform typically seen during a performance test at the terminal OUT of testing circuit shown in FIG. 11.

A typical output waveform at terminal OUT 1101 is shown in FIG. 13. The period of the oscillation Tp provides the performance data needed. Each period Tp is the sum of a pull up delay of each P-type transistor 1201 and a pull down delay of each N-type transistor 1202 in the M inverters in the ring. Thus, the average transistor switching delay is approximately Tp/(2*M). Smaller Tp translates into higher performance.

Figure 14:
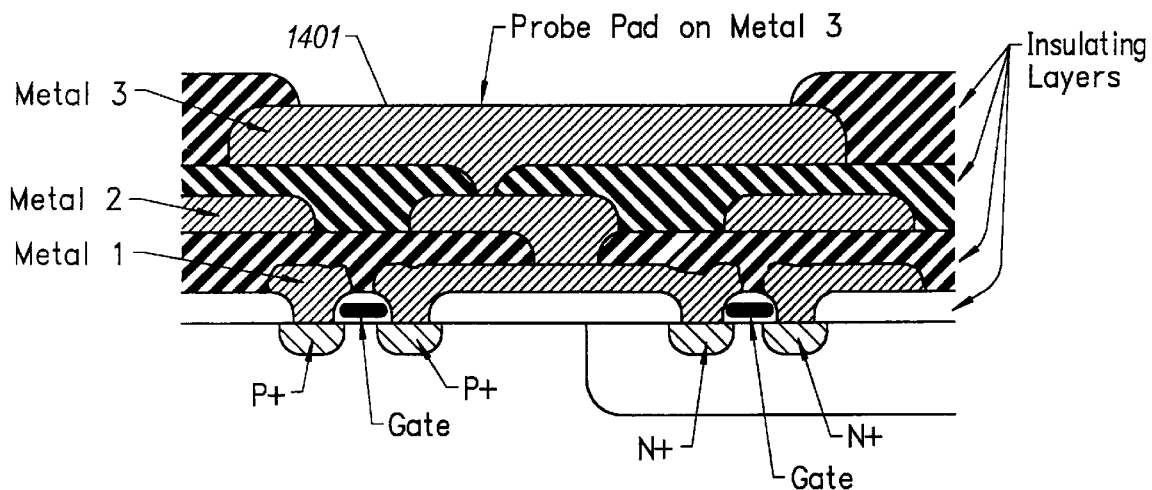
FIG. 14 is a cross-sectional drawing of the output stage of the performance test circuit illustrated in FIG. 11 showing some detail in the diffusion layers and the interconnection layers. A probing pad representing the OUT node in FIG. 11 is shown in FIG. 14 on the third metal interconnection layer allowing external probing for performance testing.

FIG. 14 shows a cross section of a wafer which includes a probe pad on third level metal. In order to access the terminals 801–804 shown in FIG. 8 and the terminals 1101–1103 shown in FIG. 11, probe pads must be provided on the third level metal layer. A probe pad 1401 is an area of metal 3 or metal 4 that is large enough for a probe normally used in the art to touch down onto and to make electrical contact with the metal. FIG. 14 is a cross sectional drawing of the output stage of the test circuit showing some details in the diffusion layers and the interconnection layers. A probing pad 1401 is shown on the third interconnection layer (metal 3) allowing external probing for performance testing.

Figure 1:
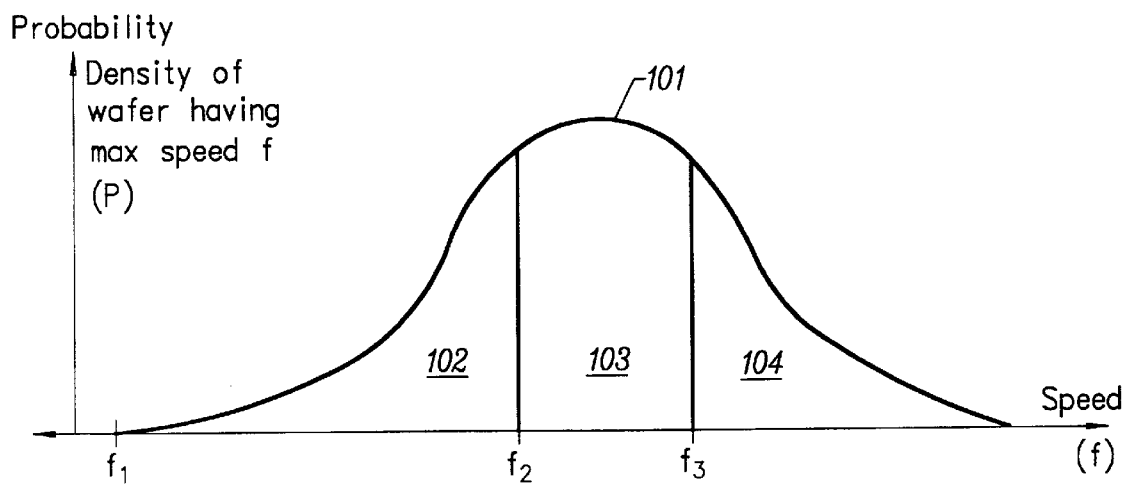
FIG. 1 illustrates a hypothetical approximately gaussian probability distribution for a wafer having a given speed and the performance specifications of three arbitrary custom designs A, B, and C.
Figure 2:
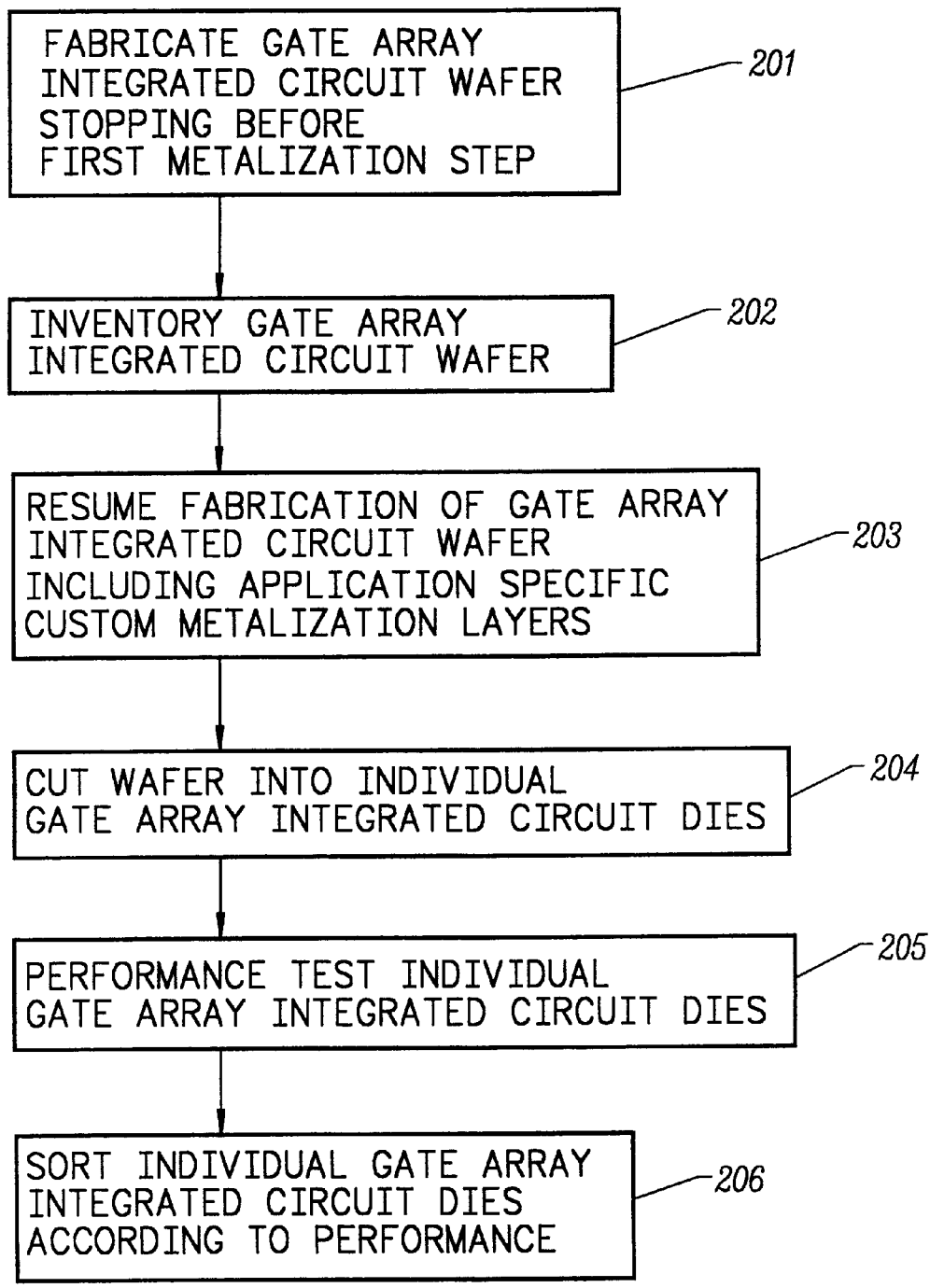
FIG. 2 is a flow chart illustrating a conventional method for fabricating gate array integrated circuits.
Figure 3:
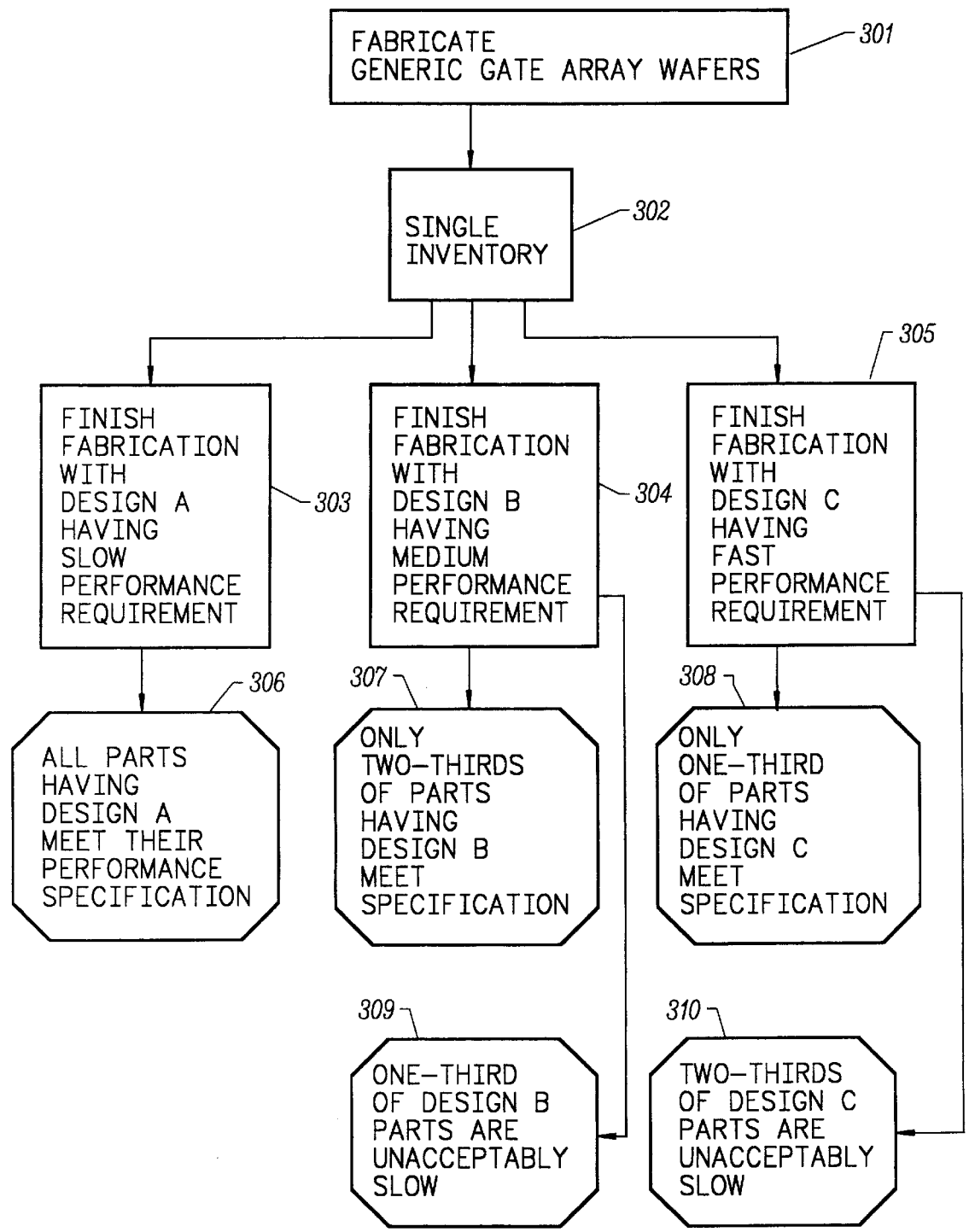
FIG. 3 is a flow chart illustrating the application of the conventional method of FIG. 2 for fabricating gate array integrated circuits to the hypothetical situation illustrated in FIG. 1.
Figure 15:
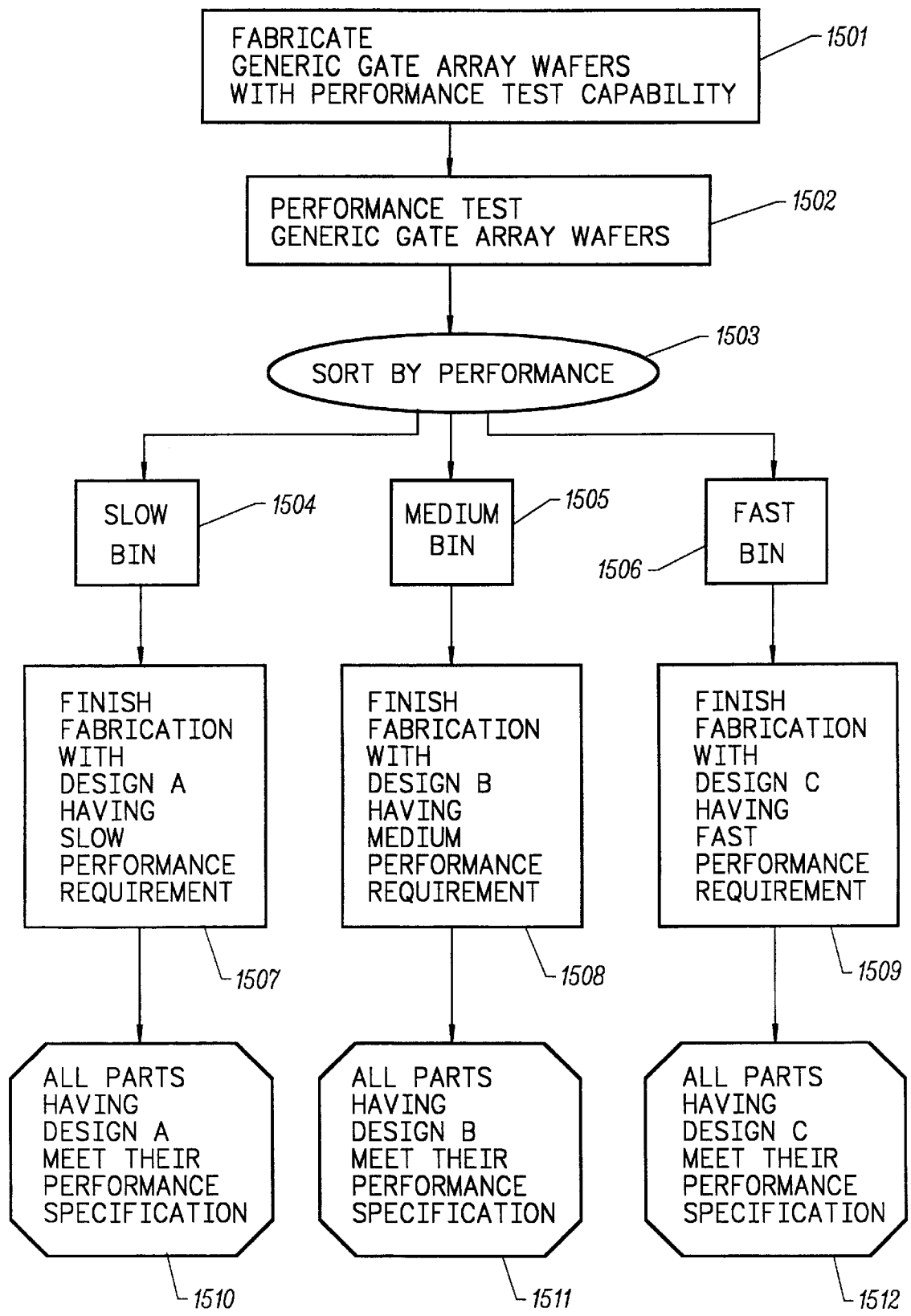
FIG. 15 is a flow chart illustrating the application of the methods according to the present invention for fabricating gate array integrated circuits to the hypothetical situation illustrated in FIG. 1.

FIG. 15 illustrates how a method of fabrication according to the present invention applies to the hypothetical situation of three separate designs A, B, and C as described in FIG. 1. In step 1501, generic gate array wafers having performance test capabilities are fabricated. In step 1502, performance testing is performed on the generic gate array wafers fabricated in step 1501. In step 1503, the wafers are sorted based upon the results of the performance test. Wafers having a speed less than f2 (in FIG. 1) are sorted into the slow bin 1504. Wafers having a speed between f2 and f3 (in FIG. 1) are sorted into the medium bin 1505. Wafers having a speed greater than f3 are sorted into the fast bin 1506. In step 1507, the wafers in the slow performance bin 1504 are retrieved and fabrication is completed for application specific design A; substantially all parts resulting from the design A custom fabrication are found at step 1510 to meet their performance requirement. In step 1508, the wafers in the medium performance bin 1505 are retrieved and fabrication is completed for application specific design B; substantially all parts resulting from the design B custom fabrication are found at step 1511 to meet their performance requirement. In step 1509, the wafers in the fast performance bin 1506 are retrieved and fabrication is completed for application specific design C; substantially all parts resulting from the design C custom fabrication are found at step 1512 to meet their performance requirement.

Figure 16:
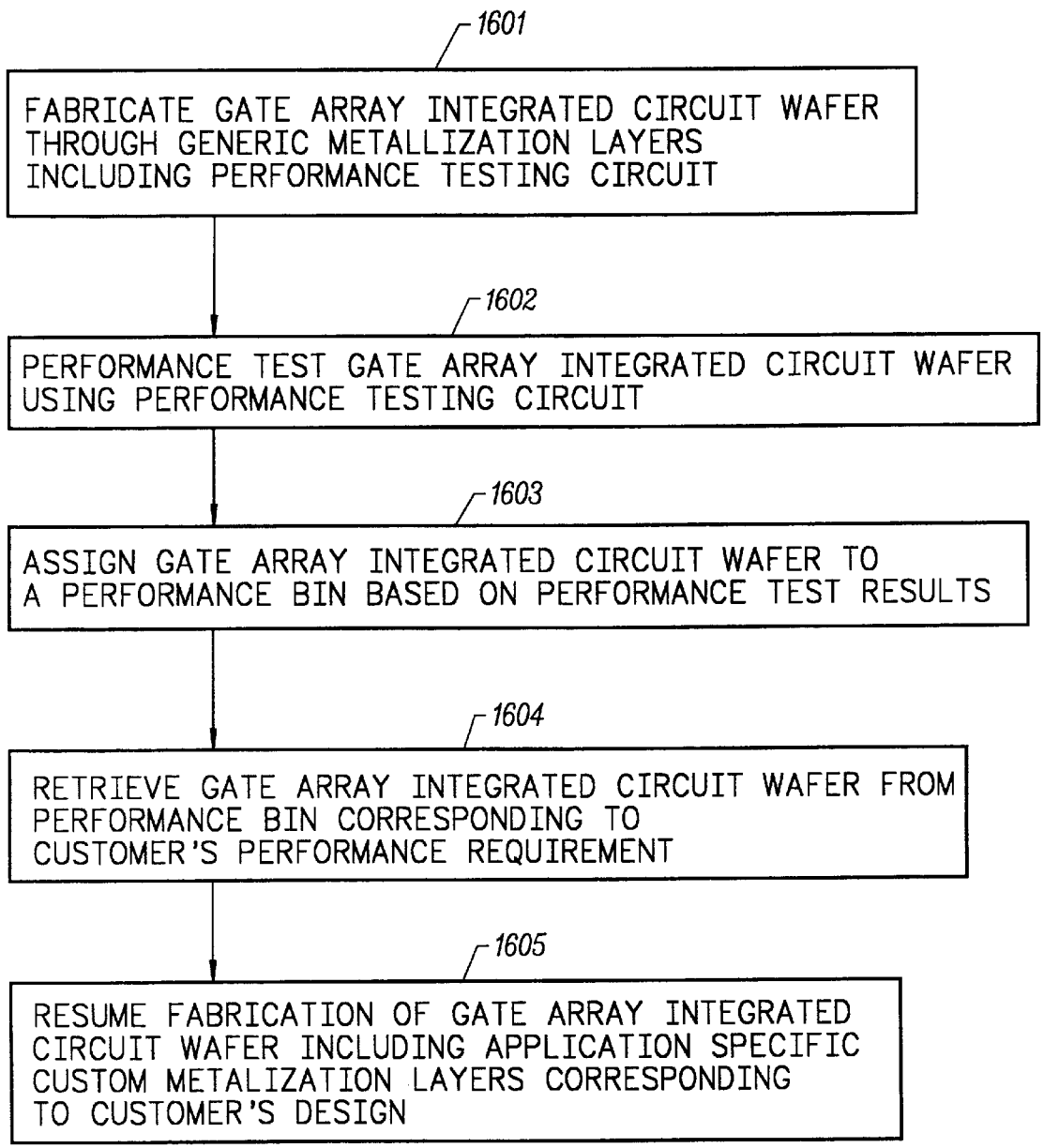
FIG. 16 is a flow chart illustrating a method of fabrication of an application specific custom gate array integrated circuit having a given performance specification according to the present invention.

FIG. 16 illustrates a general procedural flow of a method for fabricating custom application specific gate array integrated circuits according to the present invention. At step 1601 the wafers are fabricated through the generic metallization layers and including the performance testing circuit. The performance testing circuit can be either in the scribe line area or within the active die area. At step 1602 the gate array integrated circuit wafer is tested using the performance testing circuit. At step 1603 the wafer is assigned to a performance bin based upon the performance test results. At step 1604 the wafer is retrieved from the performance bin corresponding to the customer's performance requirement. At step 1605 fabrication of the wafer is resumed by adding the application specific custom metallization layers corresponding to the customer's design. There may be one or more custom layers.

Figure 19:
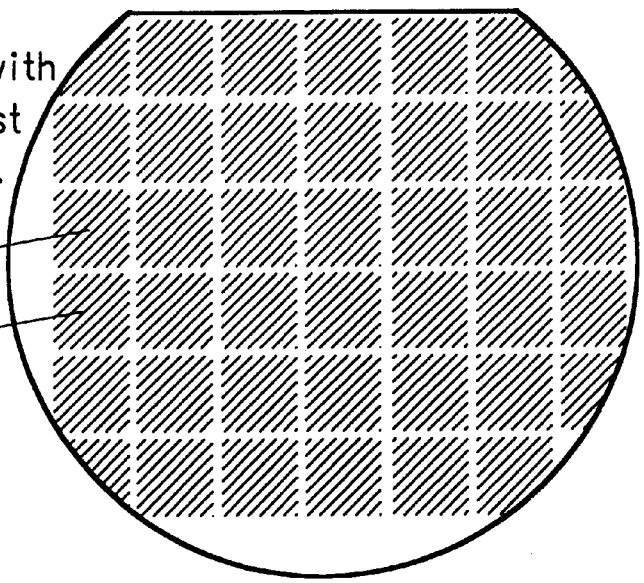
FIG. 19 illustrates a wafer having the active area protected by photoresist so as to protect the active area while selectively etching the test circuits (not shown) within the scribe line areas of the wafer.

In an alternative embodiment of the present invention, the test circuits are constructed in a similar manner to the previous embodiment, except that connections are made up to and including the top layer of metal ($M^{TH}$ Layer) before performance testing is attempted. In this alternative embodiment, the top metal layer is first selectively etched using a mask such as shown in FIG. 19 to complete the fabrication of the test circuit connections. The active die areas are completely covered by patches of solid photoresist (such as 1901 and 1902) while the scribe line areas are selectively etched. Thus, photoresist is applied to completely cover all top surfaces of the wafer except those areas where the test circuits are located. In those areas where test circuits are located, photoresist is selectively applied in an appropriate pattern to fabricate the test pattern. As a result, prior to testing, those areas of the top layer metal which will later be etched to configure the devices for a customer's application are not yet etched.

Figure 20:
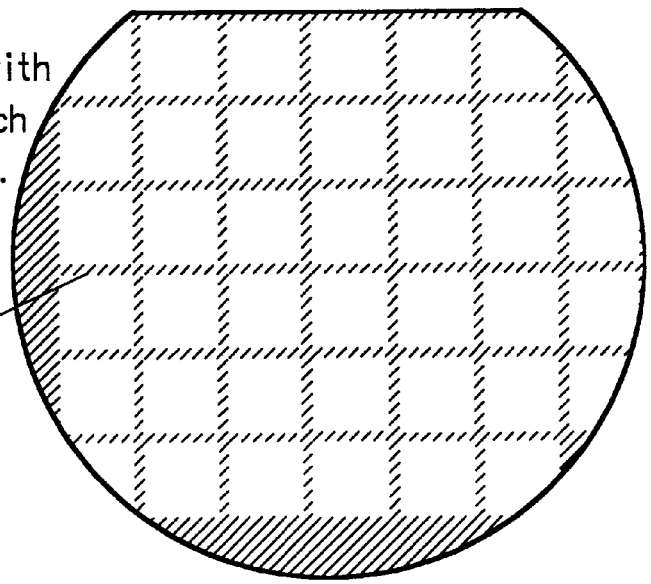
FIG. 20 illustrates a wafer having the scribe line areas protected by photoresist so as to protect the scribe line areas while selectively etching the active areas of the wafer.

Following performance testing, the wafers are inventoried according to speed. Later, the wafers that were retrieved from inventory are etched (again) on top layer metal as shown in FIG. 20 to configure the wafers to implement a customer's application specific required function. This time the test circuits in the scribe line are completely covered with photoresist 2001, as illustrated in FIG. 20.

Because the test circuits within the scribe lines are not used subsequent to the performance test which has already been performed by the time the customization of the active die is performed, the covering of the scribe line areas with photoresist 2001 is not required according to the present invention. If the scribe line areas are not covered with photoresist 2001, the probe pad and other top level metal layer wires in the performance test circuits within the scribe line areas will be etched away so that the performance test circuits are no longer functional. However, this is acceptable because the wafers are already sorted by performance and were retrieved from the performance bin based upon performance by the time the performance test circuits are destroyed during the custom etching of the top layer.

Figure 17:
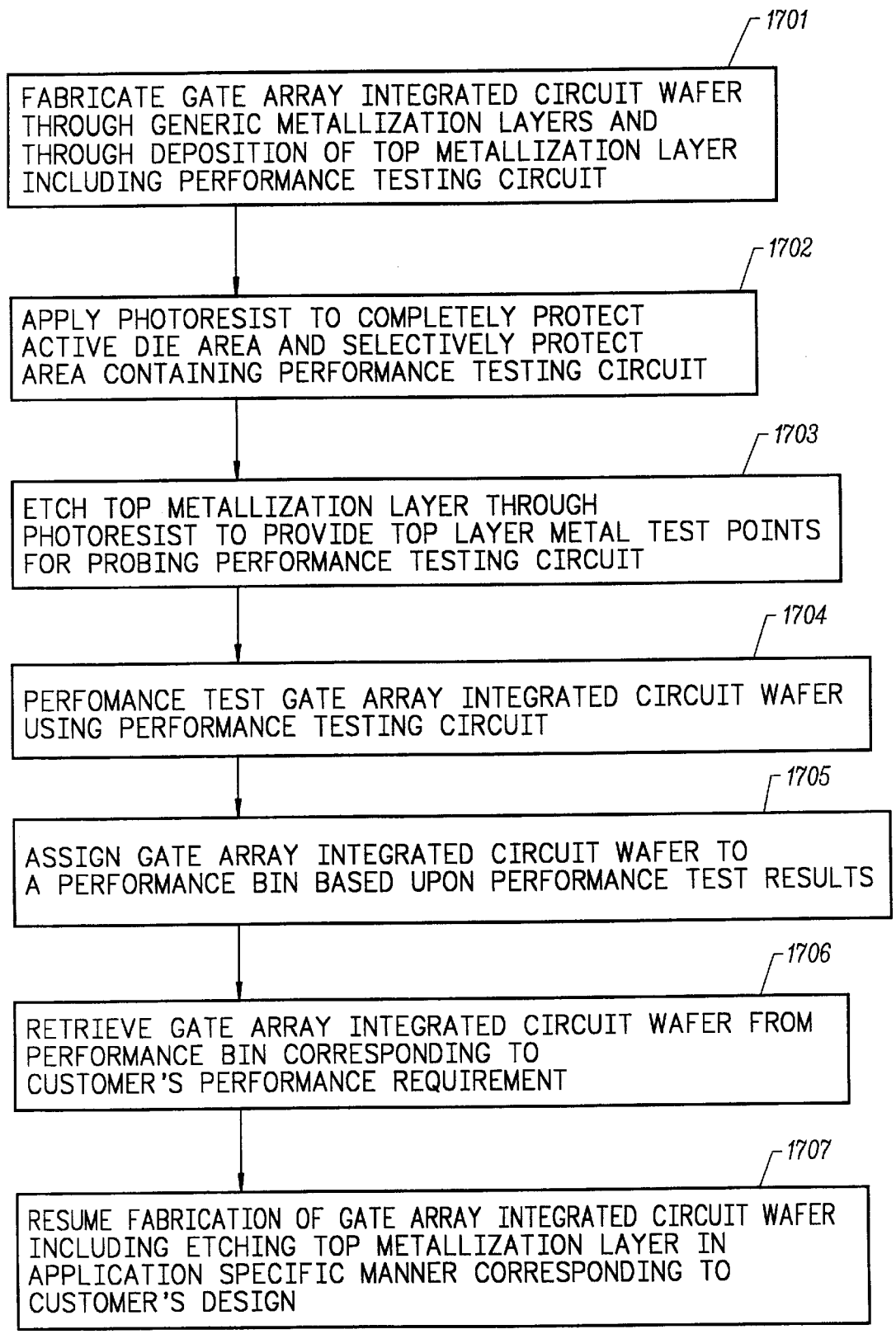
FIG. 17 is a flow chart illustrating another method of fabrication of an application specific custom gate array integrated circuit having a given performance specification according to the present invention.

FIG. 17 illustrates this alternative method of fabricating custom gate array integrated circuits according to the present invention. In step 1701, a gate array integrated circuit wafer is fabricated through the generic metallization layers and through the deposition of a top metallization layer. A performance testing circuit is included in the scribe or active die area. In step 1702, in order to make the performance testing circuit operational, photoresist is applied to completely protect the active die area and to only selectively protect the area containing the performance testing circuit. At step 1703, the top metallization layer is etched in the exposed areas of the photoresist so as to provide top layer metal test points for probing the performance testing circuit. After the photoresist is stripped away, the wafer is removed from the process tools. At step 1704, a performance test is performed on the wafer by applying a tester to the metal test points. At step 1705, the wafer is assigned to a performance bin based upon the performance test results. At step 1706, the wafer is retrieved form the performance bin corresponding to the customer's performance requirement. At step 1707, fabrication of the gate array integrated circuit wafer is resumed by applying a photoresist mask which selectively exposes areas within the active die area for the customer's application specific design. The top metallization layer is etched through the custom mask. After stripping the photoresist mask, the resulting wafer may be cut into dies, further tested, and packaged.

In addition to the standard performance test circuits described above, electrical test circuits (E-Test circuits) may be included. Electrical test circuits may contain a variety of structures for testing various parameters concerning both transistors and metal layers including metal resistance and capacitance.

Figure 21:
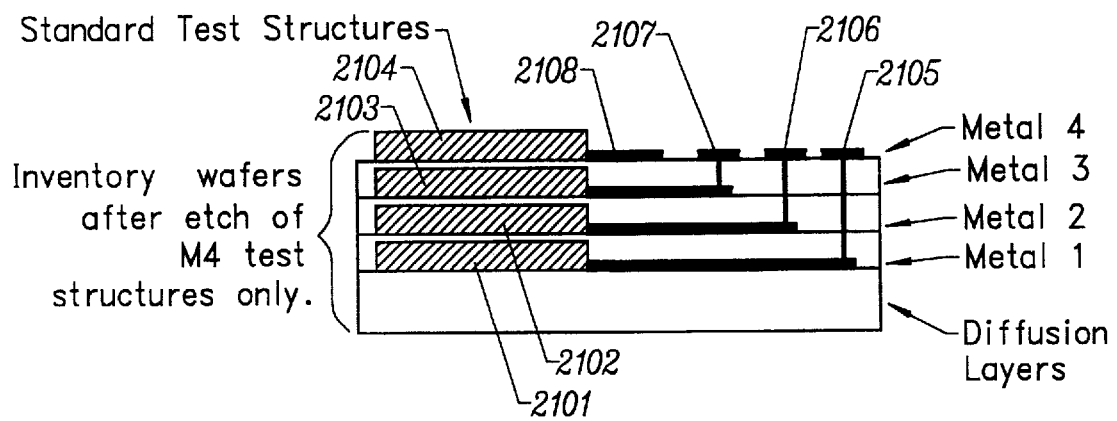
FIG. 21 illustrates a manner of connecting an upper level metal pad to each of the metal layers for performing electrical testing of all of the metal interconnection layers.

FIG. 21 illustrates that these standard E-Test circuits 2101–2104 can be fabricated in each metal layer and connected to probe pads 2105–2108 on the top layer of metal. As described above with respect to the speed performance test circuits, these structures shown in FIG. 21 are created prior to committing the wafer to be customized for a particular customer's application specific custom design.

By knowing these electrical parameters, the probability for the dies from the wafer of attaining a given required yield can be estimated. This is very useful in fast turnaround prototype situations where a poorly yielding wafer can necessitate processing another run resulting in a delay in shipping to the customer. Furthermore, the ability to perform these standard electrical tests prior to committing the wafer for customization allows bad wafers to be returned to the foundry with no questions as to the cause for the yield problem. In other words, poor results of the electrical tests is sufficient evidence to the foundry that the wafer is defective.

Figure 22:
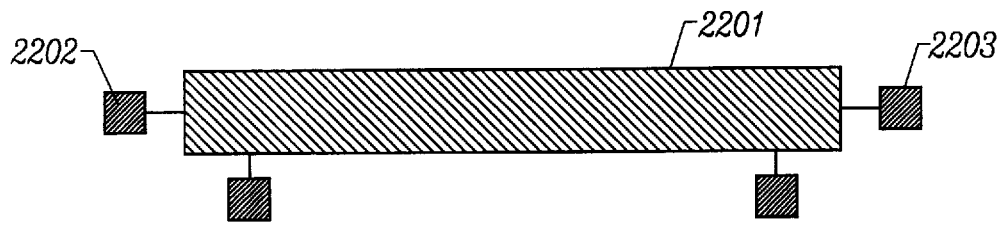
FIG. 22 illustrates a metal layer structure for determining the sheet resistance of the metal layer.
Figure 23:
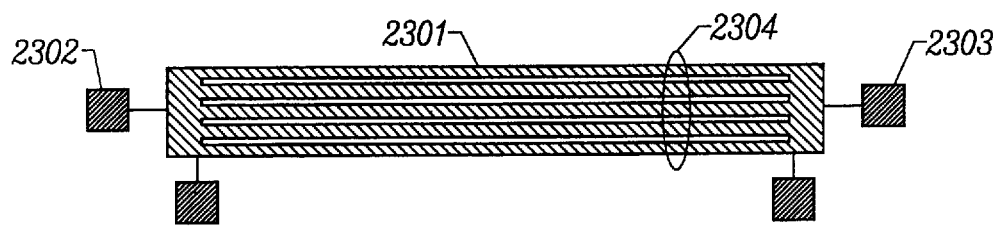
FIG. 23 illustrates a metal layer structure for determining how the metal layer's etching was performed.
Figure 24:
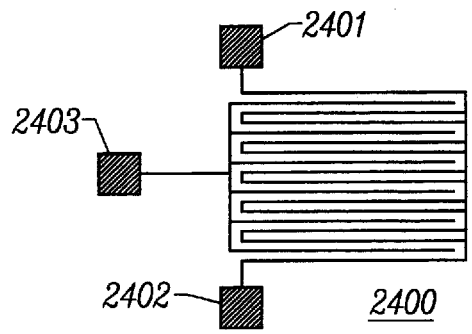
FIG. 24 illustrates a metal layer structure suitable for testing continuity, shorts, and interlayer capacitive coupling.

FIGS. 22–24 illustrate some examples of standard electrical test circuits for measuring metal characteristics. It is to be understood that the metal electrical test circuits illustrated are presented only by way of example, not by way of limitation. For example, electrical test circuits for testing polysilicon interconnection continuity and other types of electrical parameters can also be included.

FIG. 22 shows a circuit 2201, including a 4-point probe, which is used to determine the sheet resistance on a metal layer. The metal layer circuit 2201 is wide enough that the resistance between probe pads 2202 and 2203 is only negligibly affected by the degree of etching along the edges of the metal circuit 2201. In other words the width of the strip 2201 is large in comparison to the total etch variation which might occur on both side of the strip 2201.

FIG. 23 shows a circuit 2301 which is used to determine the quality of the etching of the metal layer. The resistance between probe pads 2302 and 2303 is substantially affected by over or under-etching. In other words, any etch variation which could occur in both edges of each of the five separate parallel wires 2304 is a substantial fraction of the width of each of the parallel wires 2304. If the resistance between the probe pads 2302 and 2303 is higher than expected then overetching has occurred. If the resistance between the probe pads 2302 and 2303 is lower than expected then underetching has occurred.

FIG. 24 shows a circuit 2400 which can be used to test continuity and shorts. The circuit 2400 can also be used to test for capacitive coupling between wires on the same layer. To test continuity, a test current can be driven between probe pads 2401 and 2402. An acceptably low resistance should be measured between the probe pads 2401 and 2402. To test for shorts, the resistance between probe pads 2403 and 2401 and the resistance between probe pads 2403 and 2402 should be very high or infinite. The capacitance between adjacent wires in the same layer per unit length can be estimated creating a voltage across either terminal 2403 and terminal 2401 or terminal 2403 and terminal 2402 and measuring the small charge which flowed onto (or out of) one of the terminals during the application of the voltage. For example, the charge transferred from the voltage source to node 2403 can be monitored as the voltage of node 2403 is increased from zero to five volts while nodes 2401 and/or 2402 are grounded. The capacitance per unit length is then calculated by dividing the charge by the voltage and the total length of adjacent wires on the test circuit.

Figure 18:
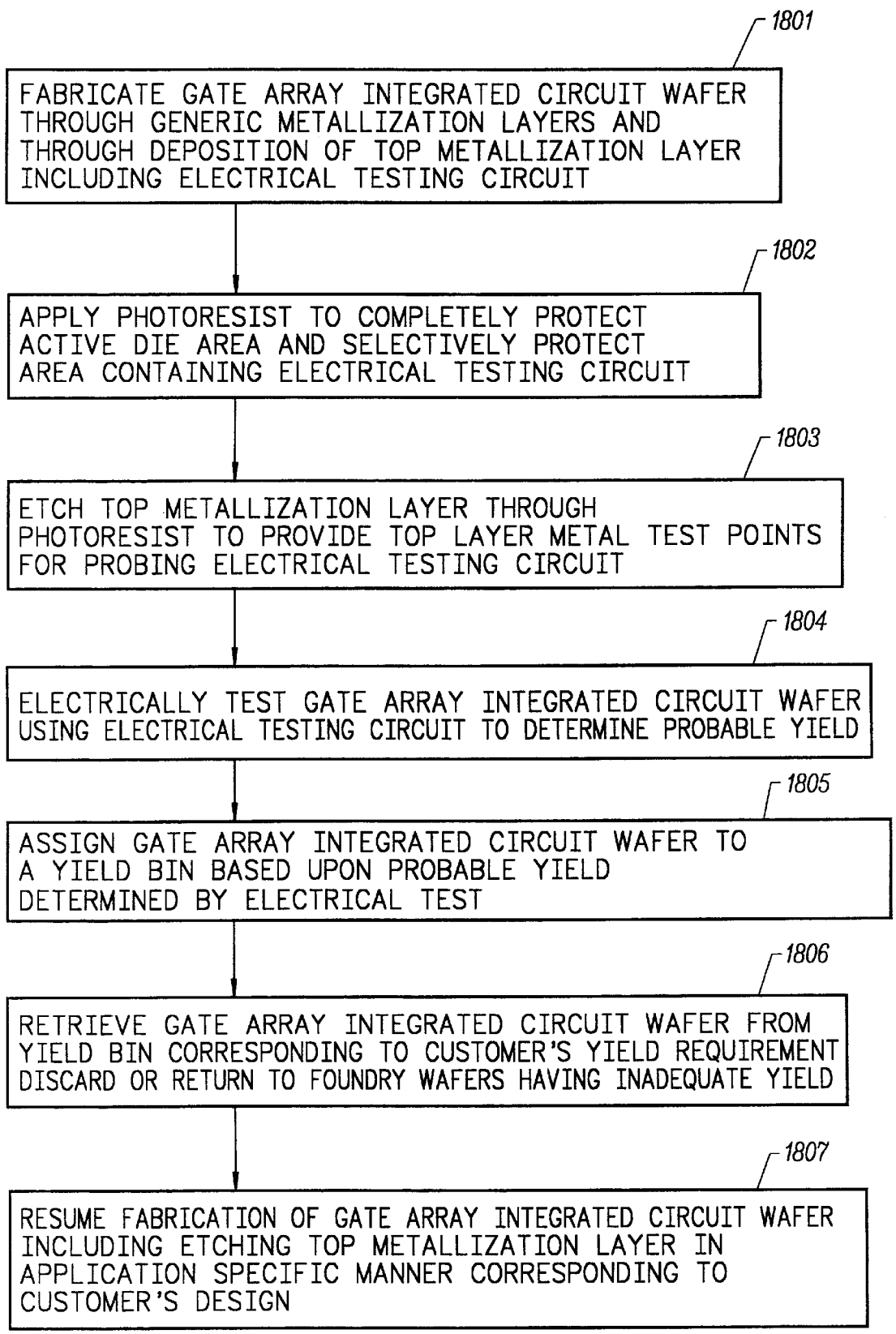
FIG. 18 is a flow chart illustrating yet another method of fabrication of an application specific custom gate array integrated circuit having a given yield requirement according to the present invention.

FIG. 18 illustrates a method for fabricating an integrated circuit having electrical testing circuits. At step 1801, the gate array integrated circuit wafer is fabricated through the generic metallization layers and through the deposition of the top metallization layer. This fabrication includes the formation of electrical testing circuits. At step 1802, a photoresist mask is applied which completely protects the active die area and selectively protects the scribe line area or active die area containing the electrical testing circuit. At step 1803, the top metallization layer is etched through the photoresist mask to provide top layer metal test points for probing the electrical test circuit. At step 1804, the electrical tests are performed. At step 1805, the wafer is assigned to a yield bin based upon the results of the electrical test. For example, if the continuity or short tests fail, then the wafer is assigned to a "defective" bin. The contents of the defective bin can be returned to the foundry or discarded. At step 1806, the wafer is retrieved form the yield bin corresponding to the customer's yield requirement. For those remaining wafers which pass the various electrical functionality tests, the probable yield can be estimated based upon the results of the electrical tests. At step 1807, fabrication of the gate array integrated circuit wafer is resumed by etching the top layer metal according to the customer's application specific design.

Although the invention has been described in detail in terms of specific embodiment, various modifications can be made without departing from the scope of the invention. For example, it should be understood that the number of interconnection layers can be more or less than 4 as described. Furthermore, the performance testing circuits described in this embodiment are just two commonly used examples. Other more or less sophisticated circuits can be used for this invention. In addition, whether to use only the top layer of interconnection or to use more layers on the top are also covered by the scope of this invention.

What is claimed is:

1. An integrated circuit wafer, comprising:
    a plurality of generic gate array dies, each die including an untestable generic gate array circuit, each circuit including M-N generically-patterned metal interconnection layers, wherein the generic gate array circuits are not yet electrically operative and are capable of receiving N application-specific custom metal interconnection layers; and
    a self-contained performance testing circuit having probe pads on the (M-N)th metal interconnection layer, wherein the performance testing circuit is accessible through the probe pads and is electrically functional.

2. An integrated circuit wafer as in claim 1,
    wherein the self-contained performance testing circuit comprises a series of buffers having an input and an output.

3. An integrated circuit wafer as in claim 1, wherein the self-contained performance testing circuit comprises a ring oscillator having an output.

4. An integrated circuit wafer as in claim 1, wherein the self-contained performance testing circuit is located in a scribe line area between the plurality of generic gate array dies.

5. An integrated circuit wafer as in claim 1, wherein the self-contained performance testing circuit is located within an active area of the generic gate array dies.

6. An integrated circuit wafer as in claim 1, wherein M is four, and N is one.

7. An integrated circuit wafer, comprising:
    a plurality of generic gate array dies, each die including an untestable generic gate array circuit, each circuit including M-1 generically-patterned metal interconnection layers and an Mth unpatterned metal interconnection layer, wherein each generic gate array circuit is not yet electrically operative; and
    a self-contained performance testing circuit having probe pads on the Mth metal interconnection layer, wherein the self-contained performance testing circuit is accessible through the probe pads and is electrically functional.

8. An integrated circuit wafer as in claim 7,
    wherein the self-contained performance testing circuit comprises a series of buffers having an input and an output.

9. An integrated circuit wafer as in claim 7, wherein the self-contained performance testing circuit comprises a ring oscillator having an output.

10. An integrated circuit wafer as in claim 7, wherein the self-contained performance testing circuit is located in a scribe line area between the plurality of generic gate array dies.

11. An integrated circuit wafer as in claim 7, wherein the self-contained performance testing circuit is located within an active area of the generic gate array dies.

12. An integrated circuit wafer as in claim 7, wherein M is four.

13. An integrated circuit wafer, comprising:
    a plurality of generic gate array dies, each die including an untestable generic gate array circuit, each circuit including M-1 generically-patterned metal interconnection layers and an Mth unpatterned metal interconnection layer, wherein each generic gate array circuit is not yet electrically operative; and
    a self-contained electrical testing circuit having probe pads on the Mth metal interconnection layer, wherein the self-contained electrical testing circuit is accessible through the probe pads and is electrically functional.

14. An integrated circuit wafer as in claim 13,
    wherein the self-contained electrical testing circuit is operative to test metal resistance on each metal layer.

15. An integrated circuit wafer as in claim 13, wherein the self-contained electrical testing circuit is operative to test etch quality on each metal layer.

16. An integrated circuit wafer as in claim 13, wherein the self-contained electrical testing circuit is located in a scribe line area between the plurality of generic gate array dies.

17. An integrated circuit wafer as in claim 13, wherein the self-contained electrical testing circuit is located within an active area of the generic gate array dies.

18. An integrated circuit wafer as in claim 13, wherein M is four.

* * * * *